United States Patent [19]

Wei

[11] Patent Number: 5,216,694
[45] Date of Patent: Jun. 1, 1993

[54] TRELLIS CODING FOR FRACTIONAL BITS

[75] Inventor: Lee-Fang Wei, Lincroft, N.J.

[73] Assignee: AT&T Bell Laboratories, Murray Hill, N.J.

[21] Appl. No.: 758,142

[22] Filed: Sep. 12, 1991

[51] Int. Cl.$^5$ .................... H04L 25/49; H04L 5/12
[52] U.S. Cl. .................................. 375/17; 375/39; 371/43
[58] Field of Search .............. 375/17, 38, 39, 40, 375/42; 371/43

[56] References Cited

U.S. PATENT DOCUMENTS

| | | | |
|---|---|---|---|
| 4,483,012 | 11/1984 | Wei | 371/43 |
| 4,831,635 | 5/1989 | Lee et al. | 375/37 |
| 4,901,331 | 2/1990 | Calderbank et al. | 375/39 |
| 4,939,555 | 7/1990 | Calderbank et al. | 375/39 |
| 4,941,154 | 7/1990 | Wei | 371/43 |
| 5,115,453 | 5/1992 | Calderbank et al. | 371/43 |

Primary Examiner—Curtis Kuntz
Assistant Examiner—Young Tse
Attorney, Agent, or Firm—Henry T. Brendzel

[57] ABSTRACT

A trellis-coded communications system for encoding a fractional number of bits is described. In this system, the number of allowed state transitions, originating from each state of a trellis encoder, is restricted to a number that is not an integral power of an integer. Furthermore, not all state transitions are used with equal probability.

14 Claims, 4 Drawing Sheets

FIG. 2
FRACTIONAL-BIT ENCODER

| INPUT BIT PATTERN (LEAD 223) | | | OUTPUT BIT PATTERN (LEAD 232) (LEAD 231) | | | |
|---|---|---|---|---|---|---|
| 0 | 0 | 0 | 0 | 0 | 0 | 0 |
| 0 | 0 | 1 | 0 | 0 | 0 | 1 |
| 0 | 1 | 0 | 0 | 1 | 0 | 0 |
| 0 | 1 | 1 | 0 | 1 | 0 | 1 |
| 1 | 0 | 0 | 1 | 0 | 0 | 0 |
| 1 | 0 | 1 | 1 | 0 | 0 | 1 |
| 1 | 1 | 0 | 0 | 0 | 1 | 0 |
| 1 | 1 | 1 | 0 | 1 | 1 | 0 |

FIG. 3
BIT CONVERTER

| INPUT BIT PATTERN | | | OUTPUT BIT PATTERN | | |
|---|---|---|---|---|---|
| 0 | 0 | 0 | 0 | 0 | 0 |
| 0 | 0 | 1 | 0 | 0 | 1 |
| 0 | 1 | 0 | 0 | 1 | 0 |
| 1 | 0 | 0 | 0 | 1 | 1 |
| 1 | 0 | 1 | 1 | 0 | 0 |
| 1 | 1 | 0 | 1 | 0 | 1 |

RATE-3/4 16-STATE TRELLIS ENCODER $^*W2_{n+1}\,W3_{n+1}\,W4_{n+1} = (101 \times W1_n W2_n W3_n + Y3_n Y2_n Y1_n)\ \mathrm{MOD}\ 1000$ BASE 2

12-PSK

5,216,694

TRELLIS CODING FOR FRACTIONAL BITS

BACKGROUND OF THE INVENTION

The present invention relates to coded modulation techniques to a

Generally, the application of trellis-coded modulation techniques to a communications system results in improvements in both the communications system's power and bandwidth efficiencies. Trellis-coded modulation techniques have been applied to communications systems that are characterized by additive white Gaussian noise (AWGN) and/or a "fading" channel. An example of an AWGN channel is the transmission path between commercial telephone-line modems. An example of a "fading" channel is that of cellular mobile radio where the received signal can sometimes be too weak to carry any useful information.

Trellis-coded modulation is often used in conjunction with a 2N-dimensional constellation, where $N \geq 1$ and each 2N-dimensional symbol from the constellation represents a number of information bits. For cases of $N > 1$, in particular, a 2N-dimensional constellation can be formed by concatenating N/M constituent 2M-dimensional constellations. Usually, M=1 so that N constituent two-dimensional (2D) constellations are used.

However, in a particular communications system, the selected 2N-dimentsional symbol and bit rates may result in a fractional number of bits per 2N-dimensional symbol, i.e., a fractional bit rate. For example, in telephone voiceband applications a 2D symbol rate of 2,742.86 (19,200/7) is typical. At the same time, however, most present-day data transmission is carried out at a selected one of a limited set of standard bit rates, e.g., 14,400 bits/sec. Use of a 2D constellation with the above symbol and bit rates results in a fractional bit rate of $14,400/2,742.86 = 5.25$ bits per 2D symbol.

In applying a trellis-coded modulation technique to a fractional bit rate communications system, the prior art has taught that the fractional information bits cannot be trellis-encoded, see, U.S. Pat. No. 4,941,154, issued Jul. 10, 1990 to L.-F. Wei. As shown in the above-mentioned prior art, for an average fractional rate of m information bits per 2N-dimensional symbol interval, where $m = n+k$, and $n > 0$ and is an integer, and $k > 0$ and is not an integer, a trellis encoder is used to encode the n, out of the $n+k$, information bits in each 2N-dimensional symbol interval into $n+1$ encoded bits. The later select one out of $2^{n+1}$ subsets, each subset comprising 2N-dimensional symbols from a 2N-dimensional constellation. However, the remaining fractional information bits, k, are not trellis-encoded but are precoded to become an integral number k' of bits, which are then used to select a 2N-dimensional symbol from the selected subset for transmission.

SUMMARY OF THE INVENTION

As noted above, the prior art has taught that the fractional information bits cannot be trellis-encoded and, as a result, are left uncoded. However, and in accordance with the invention, by restricting the number of allowed state transitions originating from each state of a trellis encoder to a number that is not an integral power of an integer it is possible to trellis-encode the fractional bits. Furthermore, different state transitions are used with unequal probabilities in the trellis encoder.

In accordance with the principles of the invention, an illustrative fractional bit trellis code is constructed with a 2D 12-ary Phase Shift Keying (12-PSK) constellation, which can carry a fractional bit rate of 2.5 information bits per 2D symbol. This trellis-coding technique is shown in the context of a cellular mobile radio application, i.e., a fading channel, and additionally has a time-diversity property, which is required for fading-channel applications.

BRIEF DESCRIPTION OF THE DRAWING

FIG. 2 is a truth table defining the operation of the fractional bit encoder used in the fractional bit system of FIG. 1;

FIG. 3 is a truth table defining the operation of the bit converter used in the fractional bit system of FIG. 1;

DETAILED DESCRIPTION

In accordance with the principles of the invention, in a trellis-coded communications system it is possible to trellis-encode a fractional number of bits. Specifically, the number of allowed state transitions originating from each state of a trellis encoder is restricted to a number that is not an integral power of an integer. Furthermore, different state transitions are used with unequal probabilities in the trellis encoder.

Figure 1:
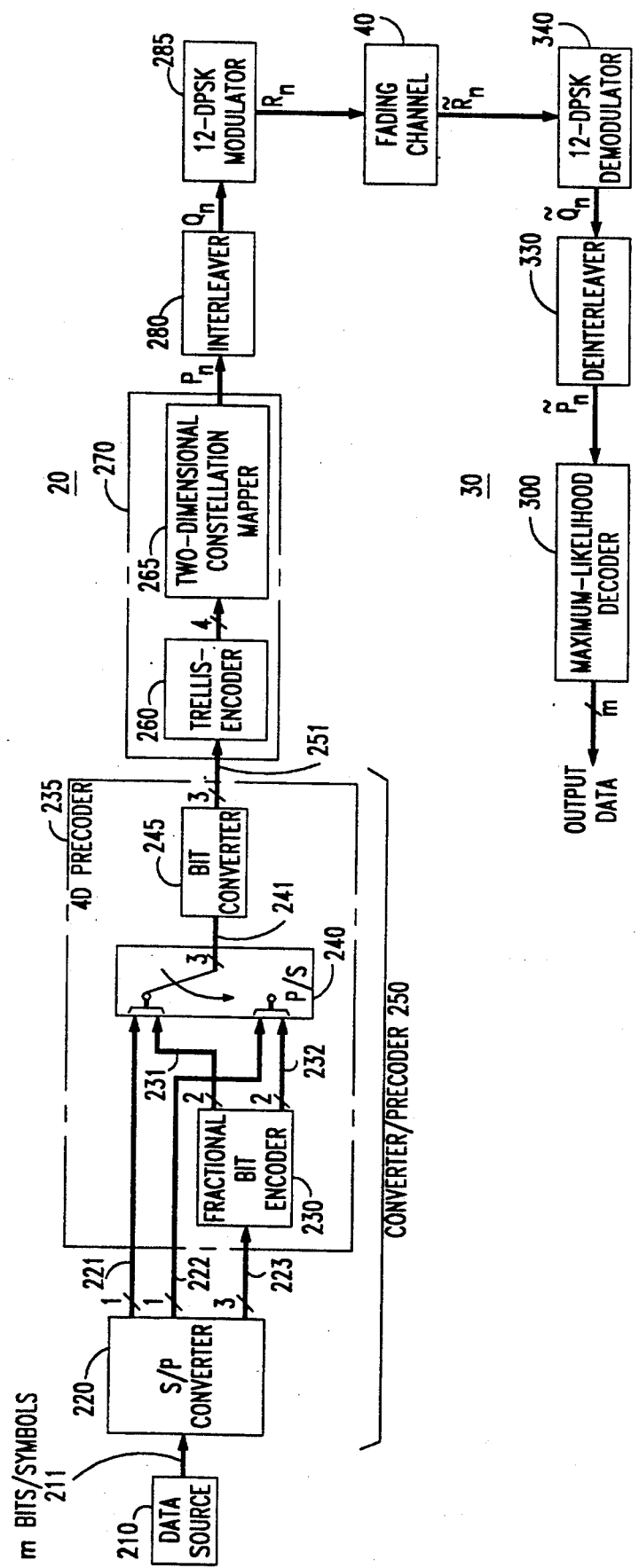
FIG. 1 is a block diagram of a fractional bit trellis-coded communications system in which the present invention is implemented.

A block diagram of a trellis-coded modulation system using a 2D constellation as applied to a fading channel, e.g., cellular mobile radio, in which the inventive concept is implemented is shown in FIG. 1. Data source 210 generates an input bit stream on lead 211 at an average fractional rate of $m = 2.5$ bits per 2D symbol. That bit stream is applied to serial-to-parallel converter 220, which aggregates two symbols worth of bits to provide 5 output bits in parallel on leads 221–223. Leads 221–223 extend to 4-dimensional (4D) precoder 235. (The significance of the adjective "4D" as applied to precoder 235 is the fact that it operates on bits associated with two 2D symbol intervals.) In precoder 235, three of the five output bits from serial-to-parallel converter 220, i.e., those bits on lead 223, are converted into two pairs of bits through fractional bit encoder 230. The latter is known as a fractional bit encoder because it divides an odd number of input bits into an even number of output groups as is shown in the fractional bit converter table of FIG. 2. Specifically, fractional bit encoder 230 converts the bits on lead 223 in accordance with the table shown in FIG. 2 and provides the output to leads 231 and 232. It can be seen from the table of FIG. 2 that each pair of output bits, on leads 231 and 232, can assume only three bit patterns, 00, 01, and 10, which are used with unequal probabilities, namely, $\frac{1}{2}$, $\frac{1}{4}$ and $\frac{1}{4}$, respectively. In addition, FIG. 2 shows that the output bit pattern 11 is not allowed.

Figure 4:
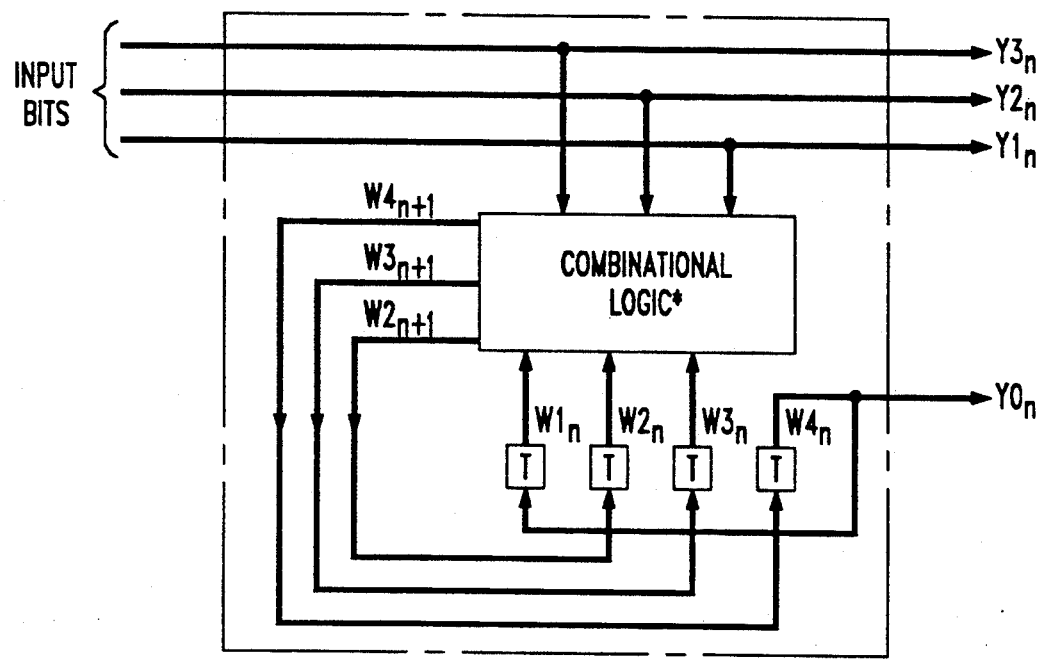
FIG. 4 is a 16-state trellis encoder used in the fractional bit system of FIG. 1.

As illustrated herein, the first (second) output group, from fractional bit encoder 230, is represented by the two bits on lead 231 (232). The first (second) output group is then paired with lead 221 (222) to provide three input bits to parallel-to-serial converter 240. The later alternately applies to its output lead 241 first, the three bits on leads 221 and 231, and then, the three bits on leads 222 and 232. The three bits of lead 241 are provided to bit converter 245, which converts these three bits in accordance with the bit converter table shown in FIG. 3. The purpose of bit converter 245 is to simplify the description of trellis encoder 260 to be described below. The output from bit converter 245 is provided, via lead 251, to trellis encoder 260. The later implements an illustrative 2D rate-$\frac{2}{3}$ 16-state trellis encoder, which is shown in FIG. 4. The combinational logic of trellis encoder 260 operates in accordance with the equation shown in FIG. 4.

Figure 5:
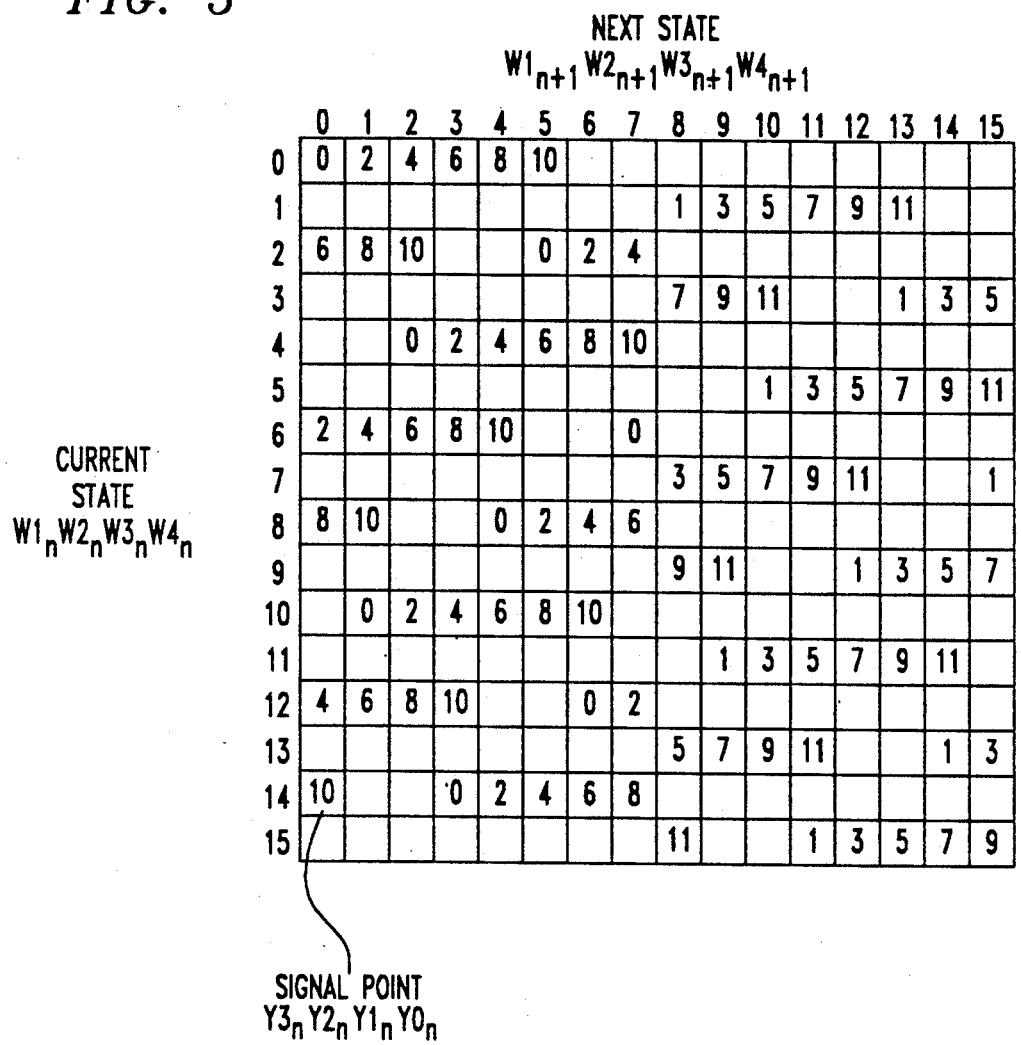
FIG. 5 is a state transition matrix for the 16-state trellis encoder of FIG. 4.

In accordance with a feature of the invention, not every possible bit pattern appears at the input of trellis encoder 260. For $Y3_n Y2_n$, the bit pattern 11 never occurs, which is made possible through the use of 4D precoder 235 discussed hereinabove. Furthermore, in accordance with the invention, the number of state transitions originating from each state of trellis encoder 260 is not a power of two or of another integer, which is shown in FIG. 5. In this figure, a filled entry represents an allowed state transition. From each current state, there are only six state transitions in this figure. The number in an entry represents the encoder output bit pattern $Y3_n Y2_n Y1_n Y0_n$ when the encoder makes the corresponding state transition. This output bit pattern will be used to select a 2D symbol from the 12-PSK constellation of FIG. 6. Further, because the input bit patterns to trellis encoder 260 appear with different probabilities, different state transitions from a current state of trellis encoder 260 are not used equally likely. As a result of the above, a fractional portion of the input bit stream, i.e., m=2.5 bits per 2D symbol, is trellis-encoded. In addition, the following can be noted about the design of the 4D precoder and the trellis diagram: (1) 2D symbols which are 180 degrees apart are used with equal probability; and (2) all trellis states are visited.

Figure 6:
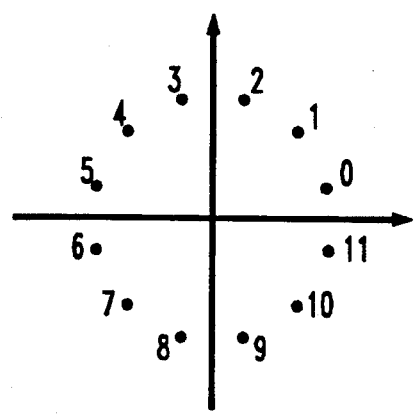
FIG. 6 is a 12-PSK constellation used in the fractional bit system of FIG. 1.

Each output bit pattern of trellis-encoder 260 is mapped by 2D-constellation-mapper 265 to a particular 2D symbol from a 12-PSK constellation as shown in FIG. 6. Both trellis-encoder 260 and constellation-mapper 265 comprise coded modulation circuitry 270 which represents a particular trellis-encoded modulation technique. The 2D symbols $P_n$, at the output of constellation-mapper 265, or alternatively, coded modulation circuitry 270, are then processed by interleaver 280. The 2D symbols $Q_n$, at the output of interleaver 280 are differentially encoded by 12-ary differential phase-shift keying (12-DPSK) modulator 285. For fading channels, DPSK is a preferred modulation/demodulation technique due to the fast variations in signal amplitiude and carrier phase which can occur. It should be noted, from the 2D constellation shown in FIG. 6, that 2D symbol 0 is shifted by $\pi/12$ radians—with the result that the 12-DPSK modulation is $\pi/12$-shifted. The use of $\pi/12$-shifted 12-DPSK modulation is desirable for reducing the peak-to-average power ratio of the transmitted signal. The output of 12-DPSK modulator 285 is transmitted over fading channel 40 to receiver 30.

In receiver 30, 12-DPSK demodulator 340 and deinterleaver 330 perform the inverse operations of 12-DPSK modulator 140 and interleaver 130, respectively. Accordingly, the output of deinterleaver 330 is the received, but channel-corrupted sequence of 2D symbols $\widetilde{P}_n$ corresponding to the sequence of 2D symbols $P_n$ at the input of interleaver 130. The output of deinterleaver 330 is input to maximum-likelihood decoder 300 (e.g., a Viterbi decoder), which will make a decision as to the most likely value of the transmitted 2D symbols in order to recover the transmitted data.

Figure 7:
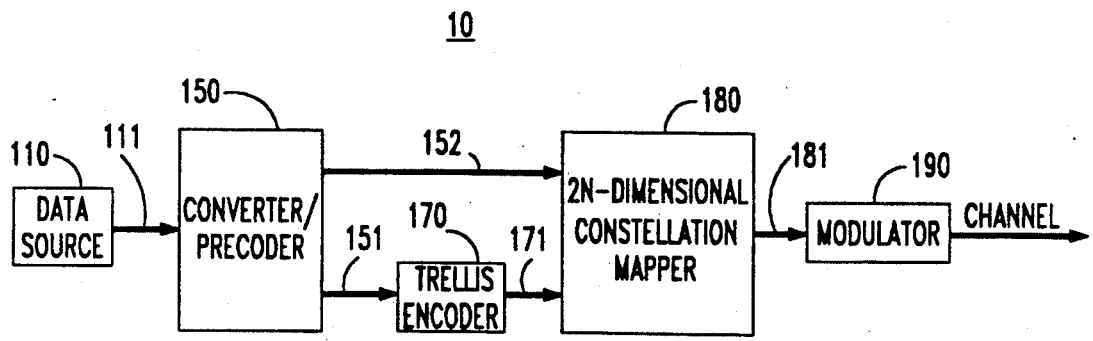
FIG. 7 is a block diagram of another trellis-coded communications system in which the present invention is implemented.

Another illustrative embodiment of the invention is shown in FIG. 7, which is a block diagram of the transmitter portion of a trellis-coded communications system using a 2N-dimensional constellation in which a fractional portion of the information bits per 2N-dimensional symbol interval are trellis-encoded. Data source 110 generates an input bit stream on lead 111 at an average rate of m=n+k information bits per 2N-dimensional symbol, where n>0 and is not an integer, and k>0 (i.e., so that depending on what k is m can be an integer or fractional number). This bit stream is applied to converter/precoder 150, which provides successive groups of output bits on leads 151 and 152, each group being delivered in each 2N-dimensional symbol interval. The group of output bits on lead 151 are provided in accordance with the principles of the invention (discussed hereinabove) to trellis encoder 170, i.e., the group of output bits on lead 151 represent a fractional part of the input bit stream, herein represented by n information bits per 2N-dimensional symbol interval. Similarly, the group of output bits on lead 152 represent the remainder of information bits per 2N-dimensional symbol interval, i.e., k, which may or may not be a fractional number and are not trellis-encoded. The trellis-encoded bits on lead 171 select a particular subset of 2N-dimensional symbols from 2N-dimensional constellation mapper 180. The group of output bits on lead 152 are applied to constellation mapper 180. These bits on lead 152 may have also been precoded in converter/precoder 150 if k is a fractional number as in the prior art. These bits identify a particular 2N-dimensional symbol from the selected 2N-dimensional subset.

The foregoing merely illustrates the principles of the invention and it will thus be appreciated that those skilled in the art will be able to devise various alternative arrangements which, although not explicitly described herein, embody the principles of the invention and are within its spirit and scope.

For example, although the invention is illustrated herein as being implemented with discrete functional building blocks, e.g., trellis encoders, constellation mappers, etc., the functions of any one or more of those building blocks can be carried out using one or more appropriate programmed processors, digital signal processing (DSP) chips, etc. In addition, although presented within the context of a fading channel application, the principles of the invention are also applicable to other areas of communications. For example, the principles of the invention can also be applied to the design of modems for use in data communications.

The following should also be noted: a trellis encoder with a different number of trellis states can be used, e.g., an 8-state trellis encoder; a signal point constellation can be 2N-dimensional, e.g., a 4D constellation, or even one-dimensional; and the signal point constellations can be of different sizes, e.g., 6-PSK. The constellation can also be a Quadrature Amplitude Modulation (QAM) type with multiple amplitudes and multiple phases.

Finally, it should be noted that bit conversion, as represented by bit converter 245 of FIG. 2, is not necessary but is only used herein to simplify the design of the trellis encoder.

I claim:

1. A method comprising the steps of
   receiving a stream of data bits at an average rate of m data bits per symbol interval, where m>0, and
   using a trellis encoder to encode a fractional portion of the m data bits in each symbol interval, where the number of state transitions in the trellis encoder is not equal to an integral power of an integer.

2. The method of claim 1 further comprising the step of precoding the received stream of m data bits to provide one of a plurality of precoded output bit patterns in each symbol interval to the trellis encoder, where the number of precoded output bits is p, p being an integer, and the plurality of precoded output bit patterns is less than $2^p$.

3. The method of claim 2 wherein at least one of the plurality of precoded output bit patterns is used with a different probability from the remaining ones of the plurality of precoded output bit patterns.

4. The method of claim 2 wherein the precoding step includes the steps of
   fractional bit encoding a portion of the stream of m data bits over a predetermined number of symbol intervals to provide one of a plurality of bit patterns in each symbol interval wherein at least one of said plurality of bit patterns is used with a different probability than the remaining ones of said plurality of bit patterns, and
   combining the one of the plurality of bit patterns in each symbol interval with the remaining portion of m data bits to provide the plurality of precoded output bit patterns in each symbol interval.

5. The method of claim 1 further comprising the step of mapping each one of the number of state transitions to one of a plurality of 2N-dimensional symbols in each symbol interval, where N is an integer, whereby over a number of symbol intervals the mapping step provides a stream of 2N-dimensional symbols.

6. A method comprising the steps of
   receiving a stream of data bits at an average rate of m data bits per symbol interval, where m>0, and
   using a trellis encoder to encode a fractional portion of the m data bits in each symbol interval, where at least one state transition of the trellis encoder is used with a different probability.

7. The method of claim 6 further comprising the step of precoding the received stream of m data bits to provide one of a plurality of precoded output bit patterns in each symbol interval to the trellis encoder, where the number of precoded output bits is p, p being an integer, and the plurality of precoded output bit patterns is less than $2^p$.

8. The method of claim 7 wherein at least one of the plurality of precoded output bit patterns is used with a different probability from the remaining ones of the plurality of precoded output bit patterns.

9. Apparatus comprising
   means for receiving a stream of data bits at an average fractional rate of m data bits per symbol interval, where m>0, and
   means for trellis encoding a fractional portion of the m data bits in each symbol interval, where the number of state transitions in the trellis encoder is not equal to an integral power of an integer.

10. The apparatus of claim 9 further comprising a means for precoding the received stream of m data bits to provide one of a plurality of precoded output bit patterns in each symbol interval to the means for trellis encoding, where the number of precoded output bit patterns is p bits, p being an integer, and the plurality of precoded output bit patterns is less than $2^p$.

11. The apparatus of claim 10 wherein at least one of the plurality of precoded output bit patterns is used with a different probability from the remaining ones of the plurality of precoded output bit patterns.

12. The apparatus claim 10 wherein the means for precoding includes
    means for fractional bit encoding a portion of the stream of m data bits over a pre-determined number of symbol intervals to provide one of a plurality of bit patterns in each symbol interval wherein at least one of said plurality of bit patterns is used with a different probability than the remaining ones of said plurality of bit patterns, and
    means for combining the one of the plurality of bit patterns in each symbol interval with the remaining portion of m data bits to provide the plurality of precoded output bit patterns in each symbol interval.

13. The apparatus of claim 10 further comprising means for mapping each one of the number of state transitions to one of a plurality of 2N-dimensional symbols in each symbol interval, where N is an integer, whereby over a number of symbol intervals the means for mapping provides a stream of 2N-dimensional symbols.

14. Apparatus comprising
    means for receiving a stream of data bits at an average fractional rate of m data bits per symbol interval, where m>0, and
    means for trellis encoding a fractional portion of the m data bits in each symbol interval, where at least one state transition of the trellis encoder is used with a different probability.

* * * * *